United States Patent
Nomura

(10) Patent No.: US 12,438,515 B2
(45) Date of Patent: Oct. 7, 2025

(54) RESONATOR DEVICE HAVING A HEATER

(71) Applicant: Seiko Epson Corporation, Tokyo (JP)

(72) Inventor: Norio Nomura, Minowa (JP)

(73) Assignee: SEIKO EPSON CORPORATION (JP)

( * ) Notice: Subject to any disclaimer, the term of this patent is extended or adjusted under 35 U.S.C. 154(b) by 835 days.

(21) Appl. No.: 17/729,068

(22) Filed: Apr. 26, 2022

(65) Prior Publication Data

US 2022/0345106 A1    Oct. 27, 2022

(30) Foreign Application Priority Data

Apr. 27, 2021 (JP) .................. 2021-074722

(51) Int. Cl.
| | | |
|---|---|---|
| H03H 9/08 | (2006.01) | |
| H03H 9/05 | (2006.01) | |
| H03H 9/10 | (2006.01) | |
| H03H 9/19 | (2006.01) | |

(52) U.S. Cl.
CPC ............ *H03H 9/08* (2013.01); *H03H 9/0557* (2013.01); *H03H 9/1021* (2013.01); *H03H 9/19* (2013.01)

(58) Field of Classification Search
CPC ...... H03H 9/08; H03H 9/0557; H03H 9/1021; H03H 9/19; H03H 9/02102; H03H 9/0547
See application file for complete search history.

(56) References Cited

U.S. PATENT DOCUMENTS

| | | | |
|---|---|---|---|
| 2006/0081605 A1 | 4/2006 | Oita et al. | |
| 2012/0139648 A1* | 6/2012 | Asamura | H03L 1/04 |
| | | | 331/70 |
| 2014/0292151 A1 | 10/2014 | Kondo | |
| 2019/0379325 A1* | 12/2019 | Kondo | H10N 30/883 |
| 2021/0126583 A1* | 4/2021 | Takeuchi | H03H 9/0557 |
| 2021/0250029 A1* | 8/2021 | Matsukawa | H03L 1/04 |

FOREIGN PATENT DOCUMENTS

| | | |
|---|---|---|
| JP | 2006-093893 A | 4/2006 |
| JP | 2014-192674 A | 10/2014 |
| JP | 2015-033065 A | 2/2015 |
| JP | 2015-092649 A | 5/2015 |
| JP | 2017-028360 A | 2/2017 |
| JP | 2021-072493 A | 5/2021 |

* cited by examiner

*Primary Examiner* — Emily P Pham
(74) *Attorney, Agent, or Firm* — Harness, Dickey & Pierce, P.L.C.

(57) ABSTRACT

A resonator device includes a substrate, a heater provided to the substrate, a temperature sensor provided to the substrate, a resonator element having a bond part bonded to the substrate, and a lid bonded to the substrate so as to house the resonator element in cooperation with the substrate, and the bond part is arranged to overlap the heater in a plan view.

7 Claims, 12 Drawing Sheets

RESONATOR DEVICE HAVING A HEATER

The present application is based on, and claims priority from JP Application Serial Number 2021-074722, filed Apr. 27, 2021, the disclosure of which is hereby incorporated by reference herein in its entirety.

BACKGROUND

1. Technical Field

The present disclosure relates to a resonator device.

2. Related Art

In JP-A-2015-33065 (Document 1), there is disclosed a quartz crystal resonator having a base substrate having a recessed part, an IC substrate fixed to a bottom surface of the recessed part, a quartz crystal element fixed to an upper surface of the IC substrate via an electrically conductive adhesive, and a lid bonded to the base substrate so as to close an opening of the recessed part. Further, on the upper surface of the IC substrate, there are arranged a temperature sensor for detecting the temperature of the quartz crystal element, and a heater circuit for heating the quartz crystal element, and there is performed control so as to keep the temperature in a package of the quartz crystal resonator constant.

However, in the quartz crystal resonator described in Document 1, since a coupling part for coupling the quartz crystal element and the IC substrate to each other and the heater circuit as a heat generation source are at a distant from each other, there is a problem that the heat of the heater circuit is not efficiently transferred to the quartz crystal element, and thus, prompt and accurate temperature control is difficult.

SUMMARY

A vibrator device includes a substrate provided with a first surface and a second surface located at an opposite side to the first surface, a heater disposed at the first surface of the substrate, a temperature sensor disposed at the first surface of the substrate, a vibrating element which is arranged at the first surface of the substrate, and has a first bond part bonded to the substrate, a lid which is bonded to the substrate so as to house the resonator element in cooperation with the substrate, and a circuit which is disposed at either one of the first surface and the second surface, and is provided with a temperature control circuit configured to control the heater based on an output of the temperature sensor, wherein the first bond part is arranged to overlap the heater in a plan view from a direction perpendicular to the first surface.

DESCRIPTION OF EXEMPLARY EMBODIMENTS

1. First Embodiment

First, a resonator device 1 according to a first embodiment will be described with reference to FIG. 1, FIG. 2, and FIG. 3, citing an oven-controlled crystal oscillator (OCXO) as an example.

Figure 1:
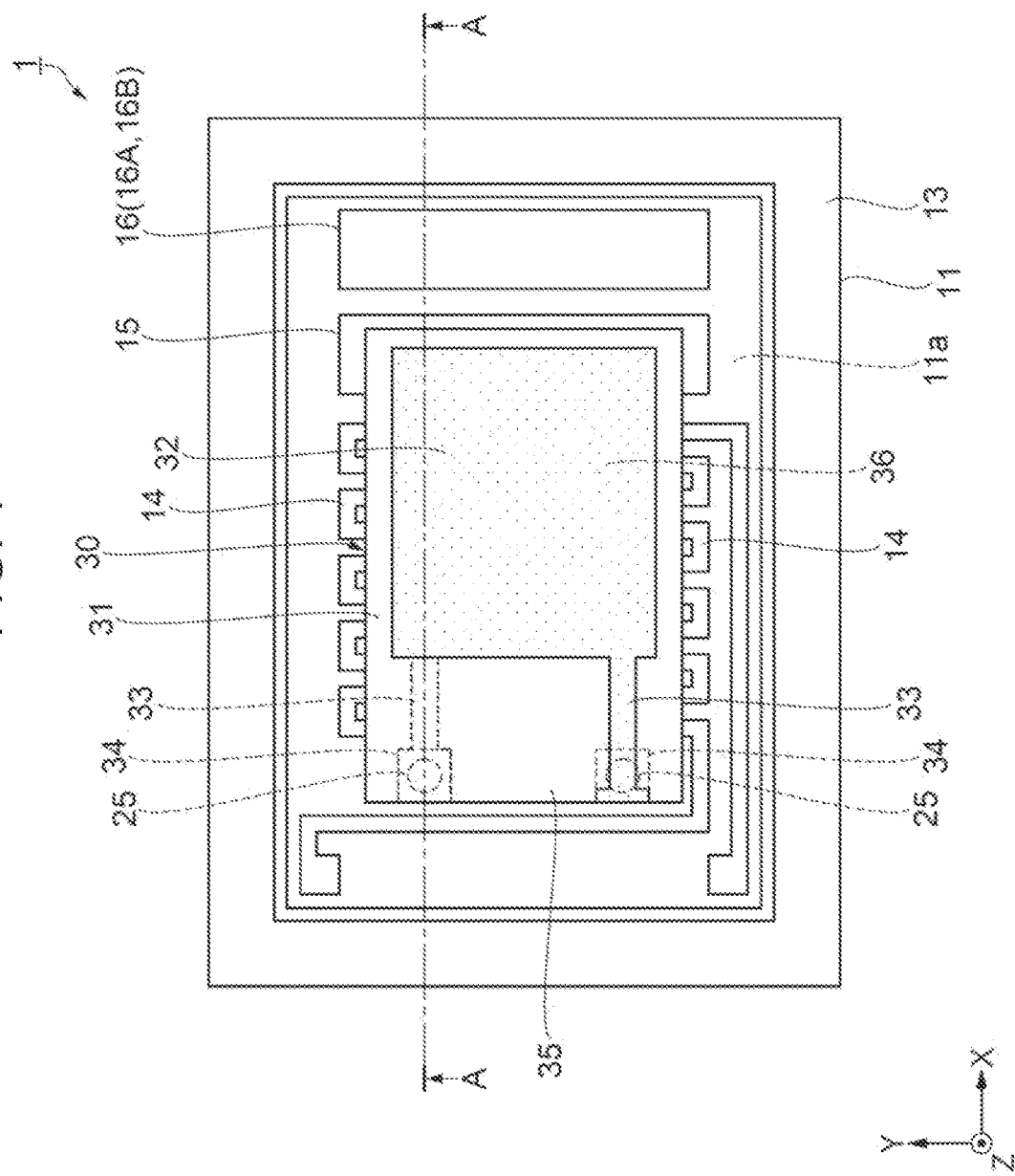
FIG. 1 is a plan view showing a schematic structure of a resonator device according to a first embodiment.

It should be noted that in FIG. 1, for the sake of convenience of explanation of an internal configuration of the resonator device 1, there is illustrated a state in which a lid 12 is removed. Further, in FIG. 3, for the sake of convenience of explanation of the internal configuration of the resonator device 1, there is illustrated a state in which the lid 12 and a resonator element 30 are removed. Further, for the sake of convenience of explanation, in each of the following drawings, an X axis, a Y axis, and a Z axis are shown as three axes perpendicular to each other. Further, a direction along the X axis is referred to as an "X direction," a direction along the Y axis is referred to as a "Y direction," and a direction along the Z axis is referred to as a "Z direction." Further, arrow side of each of the axes is also referred to as a "positive side," and the opposite side to an arrow is also referred to as a "negative side." Further, the positive side in the Z direction is also referred to as an "upper side," and the negative side in the Z direction is also referred to as a "lower side."

Figure 2:
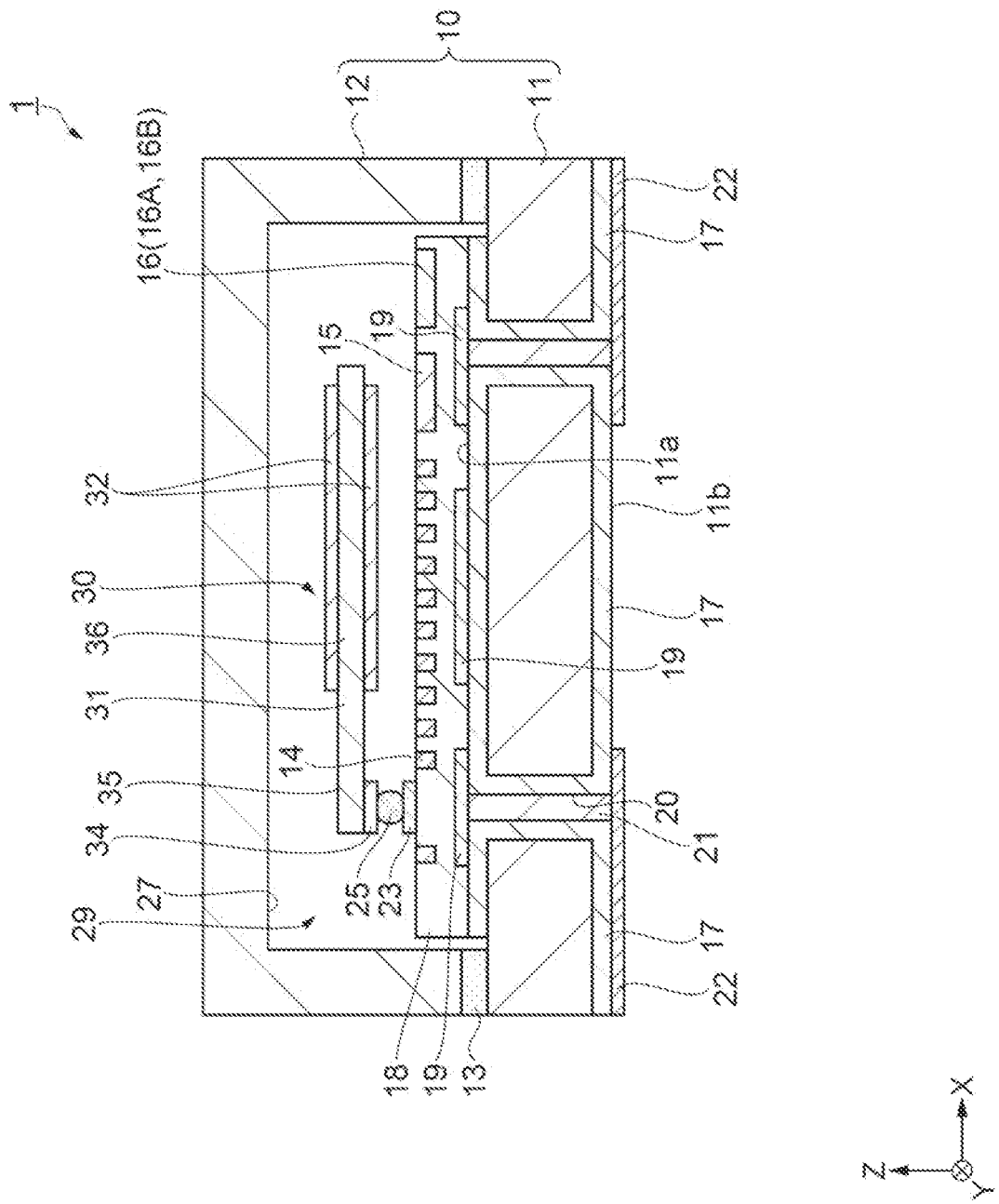
FIG. 2 is a cross-sectional view along the line A-A in FIG. 1.
Figure 3:
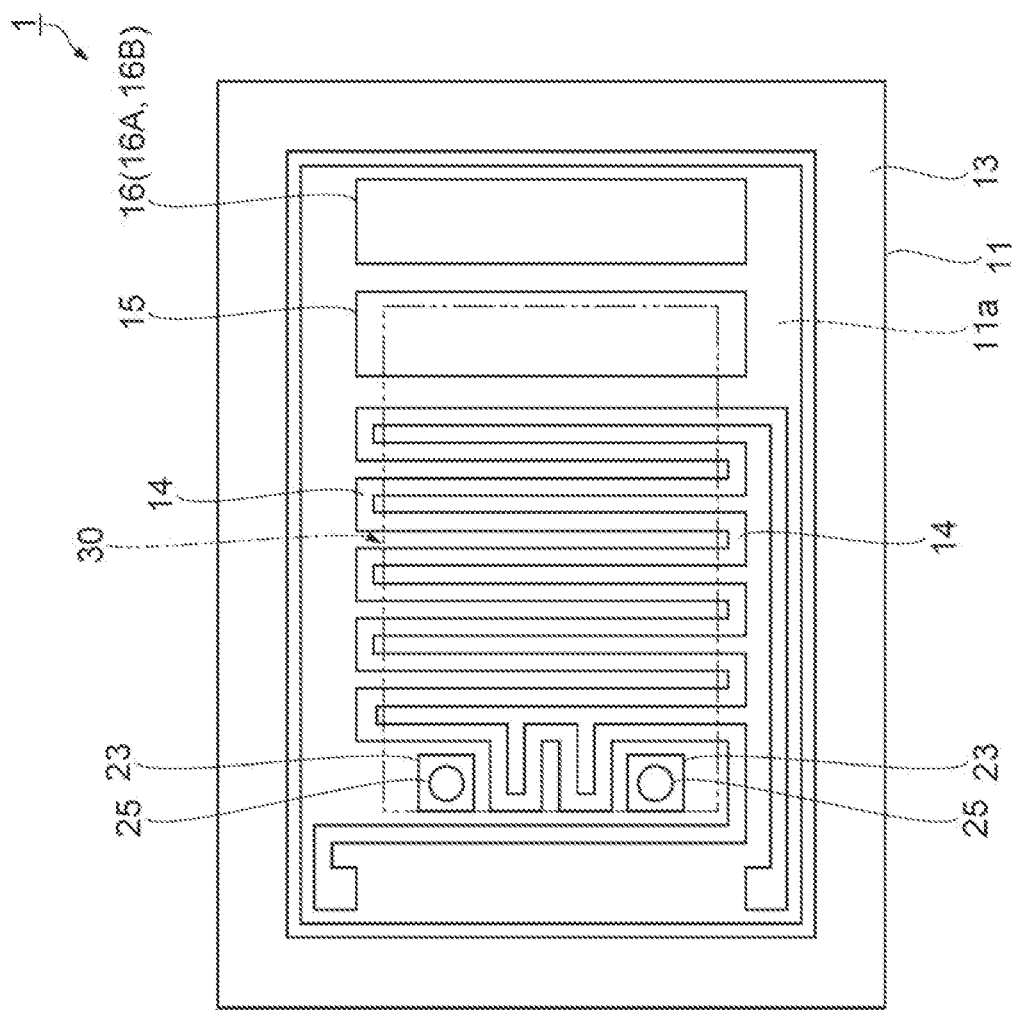
FIG. 3 is a plan view showing the schematic structure of the resonator device.
Figure 3:
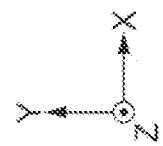

As shown in FIG. 1 and FIG. 2, the resonator device 1 has a package 10 constituted by a substrate 11 forming a base and the lid 12, the resonator element 30 housed in an internal space 29 of the package 10, and a heater 14, a temperature sensor 15, and a circuit 16 disposed at 1 first surface 11a side of the substrate 11.

The resonator element 30 is located at the first surface 11a side of the substrate 11, and is provided with a vibrating substrate 31, excitation electrodes 32 for vibrating the vibrating substrate 31, electrode terminals 34 which output oscillation signals to the outside, and which are arranged on a surface at the substrate 11 side of the vibrating substrate 31, and lead electrodes 33 which extend from the excitation electrodes 32 toward the negative side in the X direction, and which electrically couple the excitation electrodes 32 and the electrode terminals 34 to each other, respectively. Further, the vibrating substrate 31 has a vibrating part 36 on which the excitation electrodes 32 are disposed and vibrates, and a first bond part 35 which is located at the negative side in the X direction of the vibrating part 36, and which is bonded to the substrate 11.

The resonator element 30 is bonded on the first surface 11a of the substrate 11 via electrically-conductive bonding members 25 such as metal bumps or an electrically-conductive adhesive. It should be noted that as the vibrating substrate 31, there is used an AT-cut quartz crystal substrate, an SC-cut quartz crystal substrate, a BT-cut quartz crystal substrate, or the like.

The package 10 has the substrate 11 and the lid 12 bonded to the substrate 11, and houses the resonator element 30 in the internal space 29 formed between the substrate 11 and the lid 12.

The substrate 11 is a semiconductor substrate including single-crystal silicon, and in particular, a silicon substrate in the present embodiment. It should be noted that the substrate 11 is not particularly limited, and it is possible to use a semiconductor substrate other than silicon such as a semiconductor substrate made of, for example, germanium, gallium arsenide, gallium phosphate, gallium nitride, or silicon carbide, and it is possible to use a substrate other than the semiconductor substrate such as a ceramic substrate.

The substrate 11 has a plate-like shape, and has the first surface 11a on which the resonator element 30 is arranged, and a second surface 11b located at an opposite side to the first surface 11a. Further, on a surface of the substrate 11 except a bonding region to the lid 12, there is formed an insulating film 17. It should be noted that the insulating film 17 can be formed by performing thermal oxidation on the substrate 11.

On the first surface 11a of the substrate 11, there is arranged a plurality of interconnections 19 which electrically couple the heater 14 and the temperature sensor 15 formed in an insulating film 18 and the circuit 16 provided with a temperature control circuit 16A to each other, and which electrically couple the resonator element 30 bonded on the insulating film 18 and the circuit 16 provided with an oscillation circuit 16B to each other. Further, on the insulating film 17 and the interconnections 19, there is arranged the insulating film 18 forming the heater 14, the temperature sensor 15, and the circuit 16. Further, as shown in FIG. 2 and FIG. 3, bonding terminals 23 for bonding the resonator element 30 via the electrically-conductive bonding members 25 are arranged on the insulating film 18 at the position overlapping the heater 14. Bonding of the resonator element 30 to the substrate 11 specifically means to bond the bonding terminals 23 disposed on the substrate 11 and the electrode terminals 34 disposed on a surface opposed to the substrate 11 in the first bond part 35 of the resonator element to each other with the electrically-conductive bonding members 25.

In the present embodiment, since the bonding terminals 23 for bonding the resonator element 30 are arranged at the positions overlapping the heater 14 in the plan view from the Z direction as a direction perpendicular to the first surface 11a, it is possible to arrange the first bond part 35 of the resonator element 30 provided with the electrode terminals 34 so as to overlap the heater 14. Therefore, since the heat of the heater 14 is efficiently transferred to the resonator element 30, high-accuracy temperature control becomes possible, and it is possible to increase the oscillation frequency accuracy.

The circuit 16 is provided with the temperature control circuit 16A for controlling the heater 14 based on an output of the temperature sensor 15, and the oscillation circuit 16B which amplifies an output signal of the resonator element 30, and then feeds the signal thus amplified back to the resonator element 30 to thereby oscillate the resonator element 30.

The temperature control circuit 16A is a circuit for controlling an amount of the electric current flowing through the heater 14 based on temperature information output from the temperature sensor 15 to thereby keep the resonator element 30 at a constant temperature. For example, the temperature control circuit 16A performs control of making a predetermined electric current flow into the heater 14 when the current temperature determined from the output signal of the temperature sensor 15 is lower than a reference temperature set in advance, and preventing the current flowing into the heater 14 when the current temperature is higher than the reference temperature.

It should be noted that although the circuit 16 is arranged at the first surface 11a side in the present embodiment, it is possible to arrange the circuit 16 at the second surface 11b side. Further, it is possible for the circuit 16 to be provided with a temperature compensation circuit for performing temperature compensation based on the temperature information output from the temperature sensor 15 so that a frequency fluctuation in an oscillation signal of the oscillation circuit 16B becomes smaller than the frequency-temperature characteristic of the resonator element 30 itself.

On the second surface 11b of the substrate 11, there is formed a plurality of external terminals 22 which is electrically coupled to the circuit 16 disposed at the first surface 11a side via the interconnections 19 and so on.

Further, the substrate 11 is provided with a pair of through holes 20 penetrating the substrate 11 in the thickness direction. The through holes 20 are filled with an electrically-conductive material, and thus, through electrodes 21 are formed. Therefore, the external terminals 22 are electrically coupled to the circuit 16 via the through electrodes 21 and the interconnections 19, and by energizing the resonator device 1 through the external terminals 22, a voltage is applied to the excitation electrodes 32 of the resonator element 30 from the oscillation circuit 16B, and thus, it is possible to oscillate the resonator element 30. Further, the oscillation signal to be output from the oscillation circuit 16B can be output to the outside from the external terminals 22.

The lid 12 is a silicon substrate similarly to the substrate 11. Thus, the substrate 11 and the lid 12 become equal in linear expansion coefficient to each other to prevent the thermal stress to be caused by the thermal expansion from occurring, and thus, the resonator device 1 having excellent vibration characteristics is obtained. Further, since it is possible to form the resonator device 1 with the semiconductor process, the resonator device 1 can accurately be manufactured, and at the same time, it is possible to achieve reduction in size thereof. It should be noted that the lid 12 is not particularly limited, and it is possible to use a semiconductor substrate other than silicon such as a semiconductor substrate made of, for example, germanium, gallium arsenide, gallium phosphate, gallium nitride, or silicon carbide. Further, it is also possible to use a substrate other than the semiconductor substrate such as a metal substrate made of, for example, Kovar or a glass substrate.

The lid 12 has a recessed part 27 which has a bottom, opens at the substrate 11 side, and houses the resonator element 30 inside. Further, the lower surface of the lid 12 is bonded to the substrate 11 via a bonding member 13. Thus, together with the substrate 11, the lid 12 forms the internal space 29 for housing the resonator element 30. It should be noted that as the method of bonding the substrate 11 and the lid 12 to each other, it is possible to adopt a bonding method such as diffusion bonding using diffusion of the metal included in the substrate 11 and the lid 12 without an intervention of the bonding member 13.

Further, the internal space 29 is airtightly sealed, and is set in a reduced-pressure state, and is preferably set in a state approximate to a vacuum state. Thus, the viscosity resistance reduces and oscillation characteristics of the resonator element 30 are improved. It should be noted that the atmosphere in the internal space 29 is not particularly limited, and can be an atmosphere filled with an inert gas such as nitrogen or argon, or can also be in the atmospheric pressure state or a pressurized state instead of the reduced-pressure state.

As described hereinabove, in the resonator device 1 according to the present embodiment, since the first bond part 35 of the resonator element 30 is arranged so as to overlap the heater 14 in the plan view from the Z direction, the heat of the heater 14 is efficiently transferred to the resonator element 30. Therefore, it is possible to perform high-accuracy temperature control on the resonator element 30, and thus, it is possible to improve the oscillation frequency accuracy in the output from the resonator device 1.

2. Second Embodiment

Then, a resonator device 1a according to a second embodiment will be described with reference to FIG. 4 and FIG. 5. It should be noted that in FIG. 4, for the sake of convenience of explanation of an internal configuration of the resonator device 1a, there is illustrated a state in which the lid 12 and the resonator element 30 are removed.

The resonator device 1a according to the present embodiment is substantially the same as the resonator device 1 according to the first embodiment except the fact that an arrangement position of a temperature sensor 15a and the shape of a heater 14a are different compared to the resonator device 1 according to the first embodiment. It should be noted that there is presented the description with a focus on the differences from the first embodiment described above, and regarding substantially the same matters, the same reference symbols are provided, and the explanation thereof will be omitted.

Figure 4:
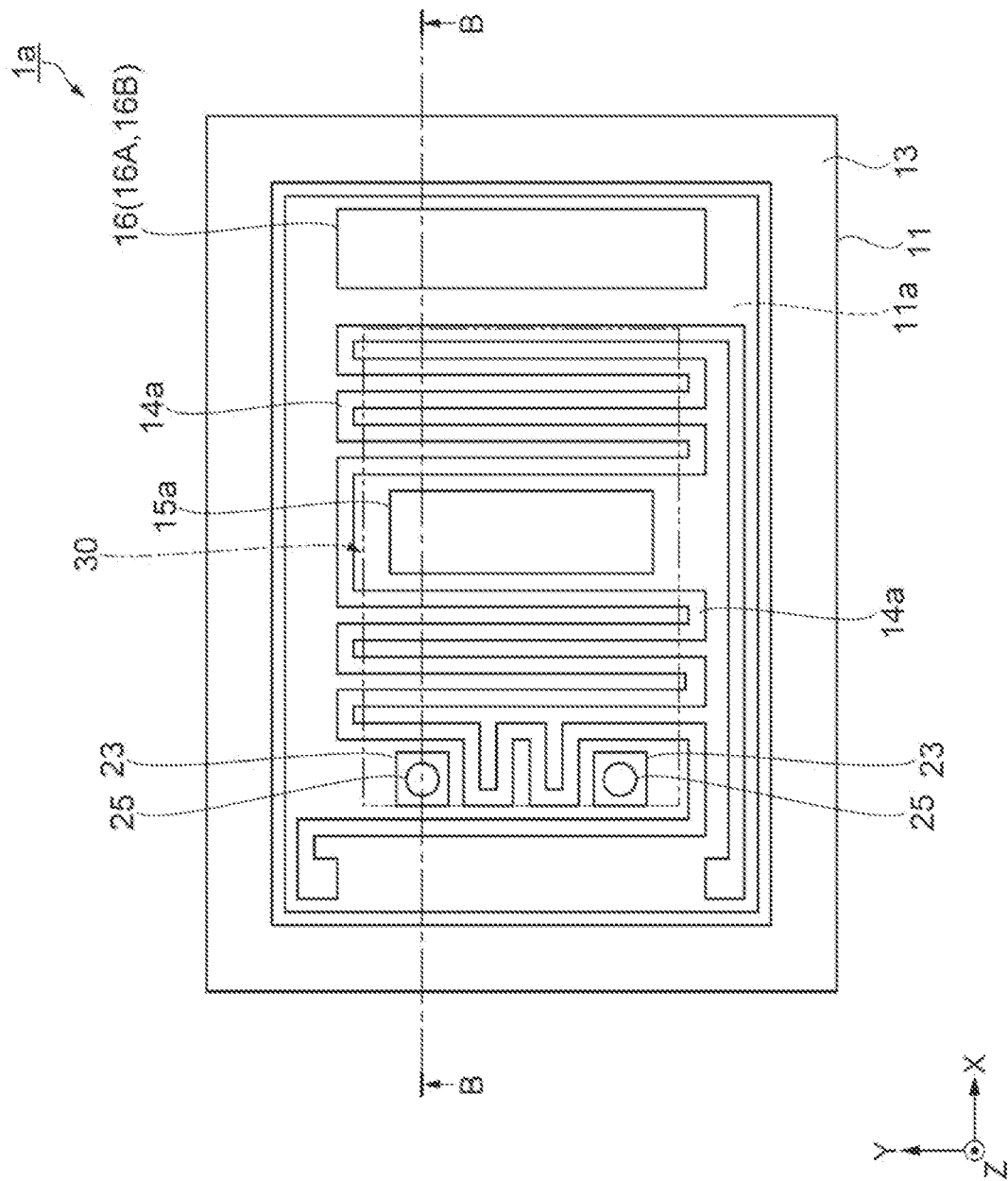
FIG. 4 is a plan view showing a schematic structure of a resonator device according to a second embodiment.
Figure 5:
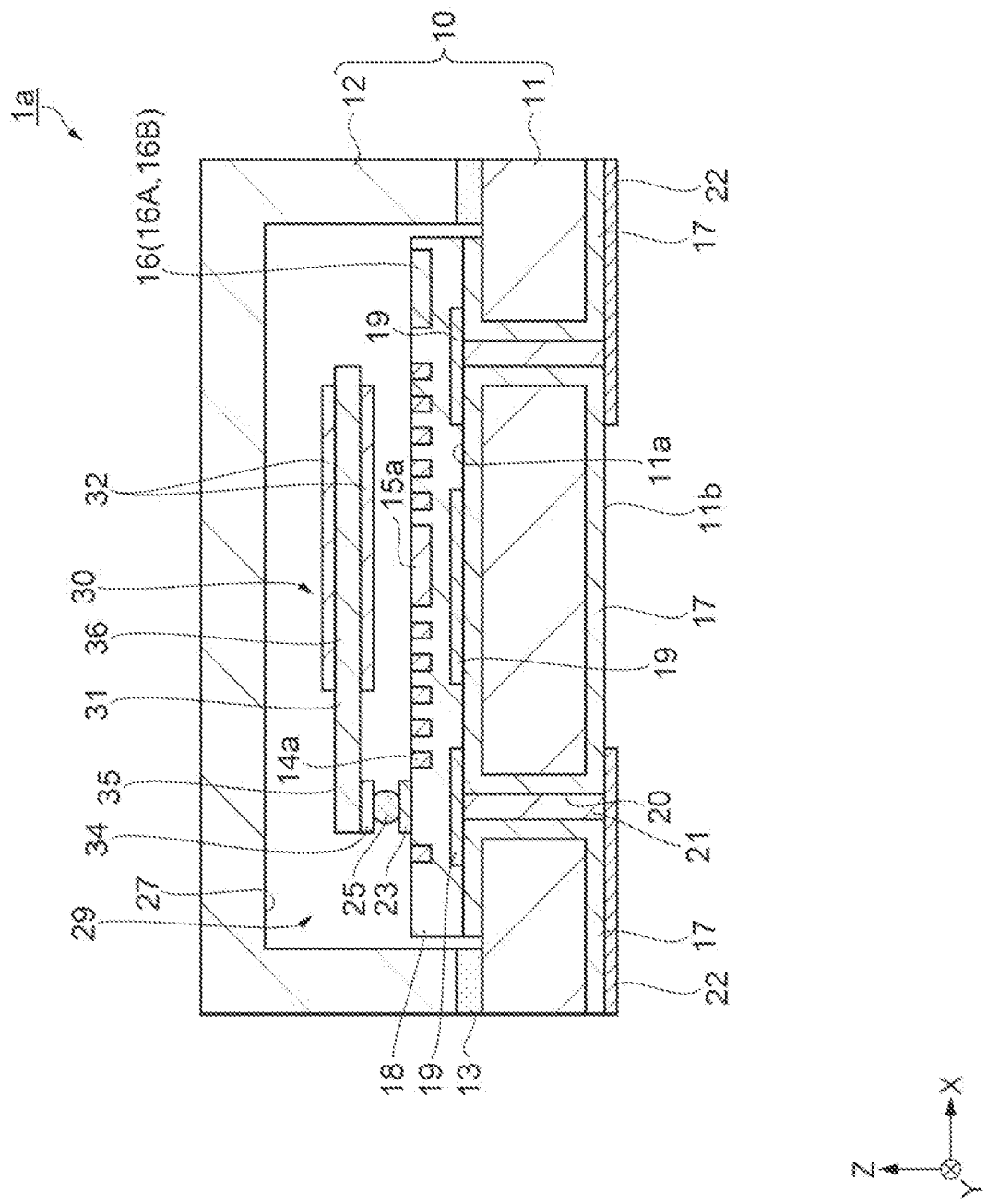
FIG. 5 is a cross-sectional view along the line B-B in FIG. 4.

As shown in FIG. 4 and FIG. 5, the resonator device 1a has the resonator element 30, the heater 14a, the temperature sensor 15a, and the circuit 16 at the first surface 11a side of the substrate 11.

As shown in FIG. 4, the heater 14a forms a pattern shape surrounding the temperature sensor 15a in the plan view from the Z direction.

The temperature sensor 15a is located at substantially the center of the substrate 11, and is arranged so as to be surrounded by the heater 14a in the plan view from the Z direction.

By adopting such a configuration, it is possible to suppress a difference in temperature between the resonator element 30, the heater 14a, and the temperature sensor 15a to a lower level, and thus, it is possible to obtain substantially the same advantage as that of the resonator device 1 according to the first embodiment.

3. Third Embodiment

Then, a resonator device 1b according to a third embodiment will be described with reference to FIG. 6, FIG. 7, and FIG. 8. It should be noted that in FIG. 6, for the sake of convenience of explanation of an internal configuration of the resonator device 1b, there is illustrated a state in which the lid 12 is removed. Further, in FIG. 8, for the sake of convenience of explanation of the internal configuration of the resonator device 1b, there is illustrated a state in which the lid 12 and a resonator element 30b are removed.

The resonator device 1b according to the present embodiment is substantially the same as the resonator device 1 according to the first embodiment except the fact that there are three bonding positions between the substrate 11 and the resonator element 30b, and the shapes of the resonator element 30b and a heater 14b, and an arrangement position of a temperature sensor 15b are different compared to the resonator device 1 according to the first embodiment. It should be noted that there is presented the description with a focus on the differences from the first embodiment described above, and regarding substantially the same matters, the same reference symbols are provided, and the explanation thereof will be omitted.

Figure 6:
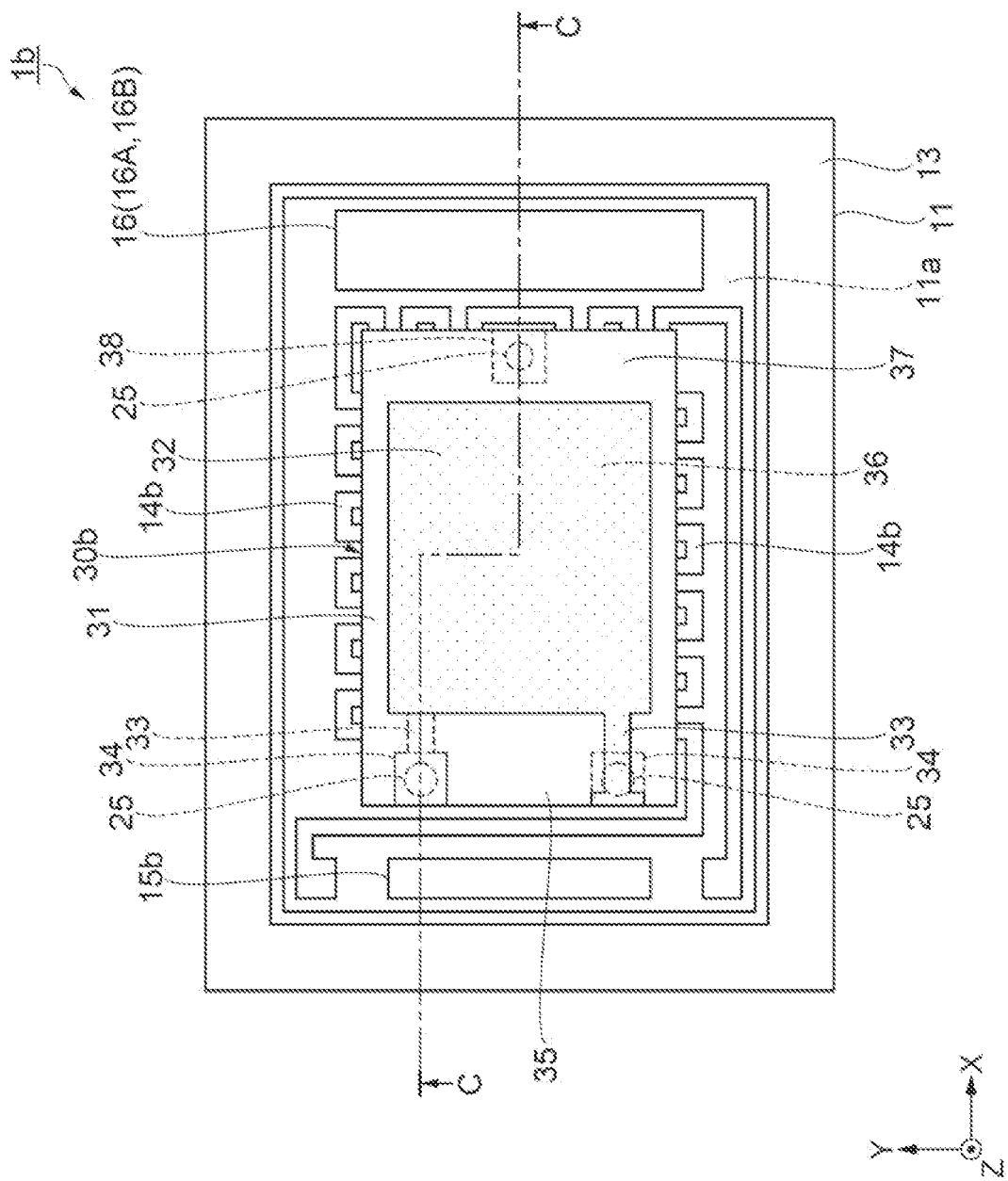
FIG. 6 is a plan view showing a schematic structure of a resonator device according to a third embodiment.
Figure 7:
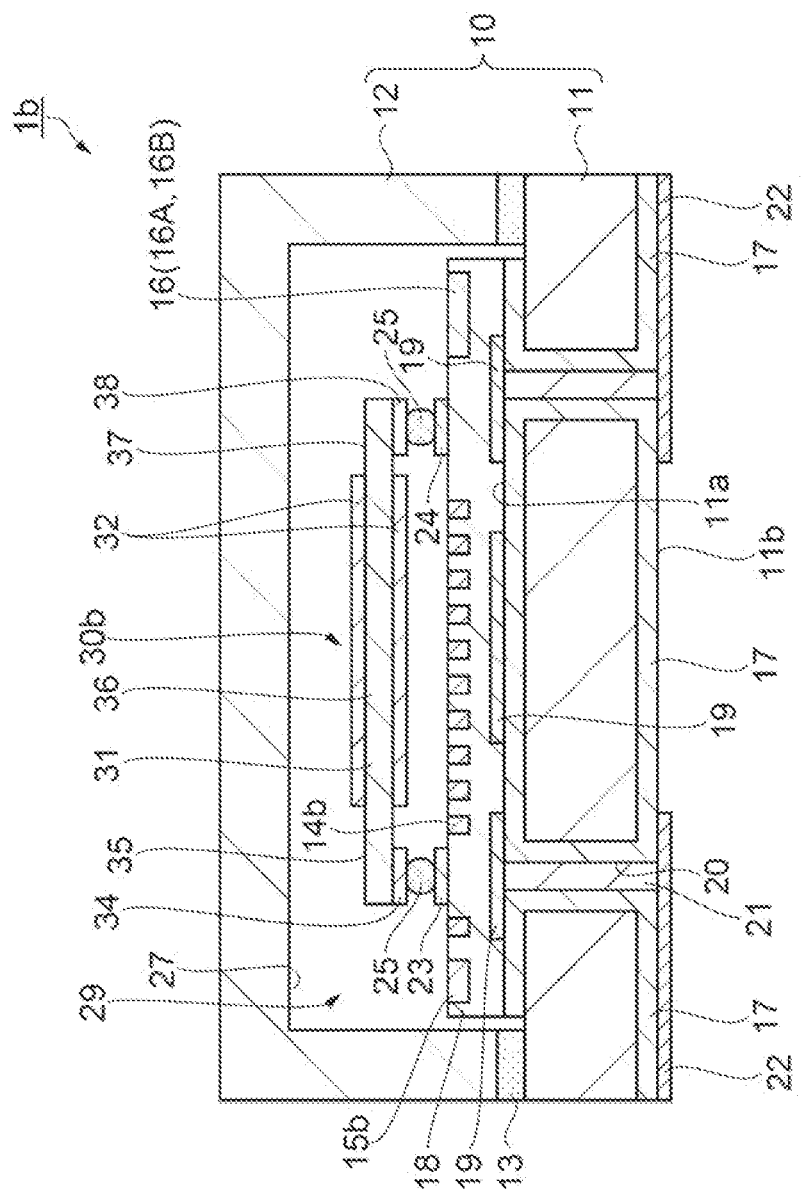
FIG. 7 is a cross-sectional view along the line C-C in FIG. 6.

As shown in FIG. 6 and FIG. 7, the resonator device 1b has the resonator element 30b, the heater 14b, the temperature sensor 15b, and the circuit 16 at the first surface 11a side of the substrate 11.

In the plan view from the Z direction, the resonator element 30b has a second bond part 37 which is arranged at an opposite side to the first bond part 35 across the vibrating part 36, and is arranged so as to overlap the heater 14b. An electrode terminal 38 disposed on a surface opposed to the substrate 11 of the second bond part 37, and a bonding terminal 24 disposed on the substrate 11 are bonded to each other via the electrically-conductive member 25. Therefore, the resonator element 30b is bonded to the substrate 11 at the two places in the first bond part 35, and the one place in the second bond part 37, namely at the three places in total.

Figure 8:
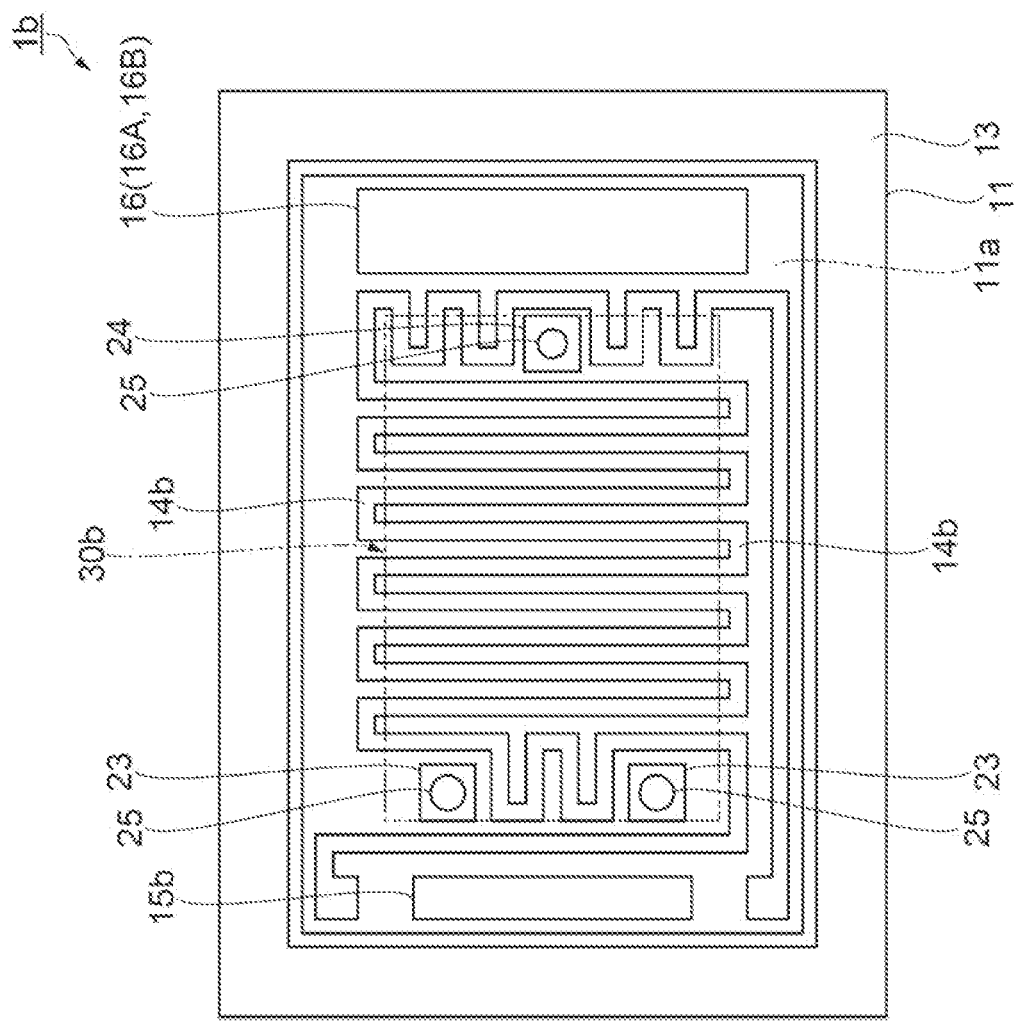
FIG. 8 is a plan view showing the schematic structure of the resonator device.
Figure 8:
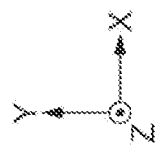

As shown in FIG. 8, the heater 14b forms a pattern shape surrounding the three bonding terminals 23, 24 for bonding the resonator element 30b in the plan view from the Z direction.

The temperature sensor 15b is arranged at the negative side in the X direction of the heater 14b.

By adopting such a configuration, since the heat of the heater 14b is transferred via the two places in the first bond part 35 to be bonded to the substrate 11 and the one place in the second bond part 37 arranged at the opposite side to the first bond part 35 across the vibrating part 36, it is possible to suppress the temperature variation in the resonator element 30b. Further, since the resonator element 30b is held at the three places, it is possible to enhance an impact resistance with respect to a drop impact and so on, and thus, it is possible to obtain substantially the same advantages as in the resonator device 1 according to the first embodiment.

4. Fourth Embodiment

Then, a resonator device 1c according to a fourth embodiment will be described with reference to FIG. 9 and FIG. 10. It should be noted that in FIG. 9, for the sake of convenience of explanation of an internal configuration of the resonator device 1c, there is illustrated a state in which the lid 12 is removed.

The resonator device 1c according to the present embodiment is substantially the same as the resonator device 1 according to the first embodiment except the fact that a circuit 16c is arranged at the second surface 11b side, first through electrodes 21a to electrically be coupled to the heater 14, second through electrodes 21b to electrically be coupled to the temperature sensor 15, and third through electrodes 21c to electrically be coupled to the resonator element 30 are provided to a substrate 11c, and an insulating layer 40 covering the circuit 16c is provided compared to the resonator device 1 according to the first embodiment. It should be noted that there is presented the description with a focus on the differences from the first embodiment described above, and regarding substantially the same matters, the same reference symbols are provided, and the explanation thereof will be omitted.

Figure 9:
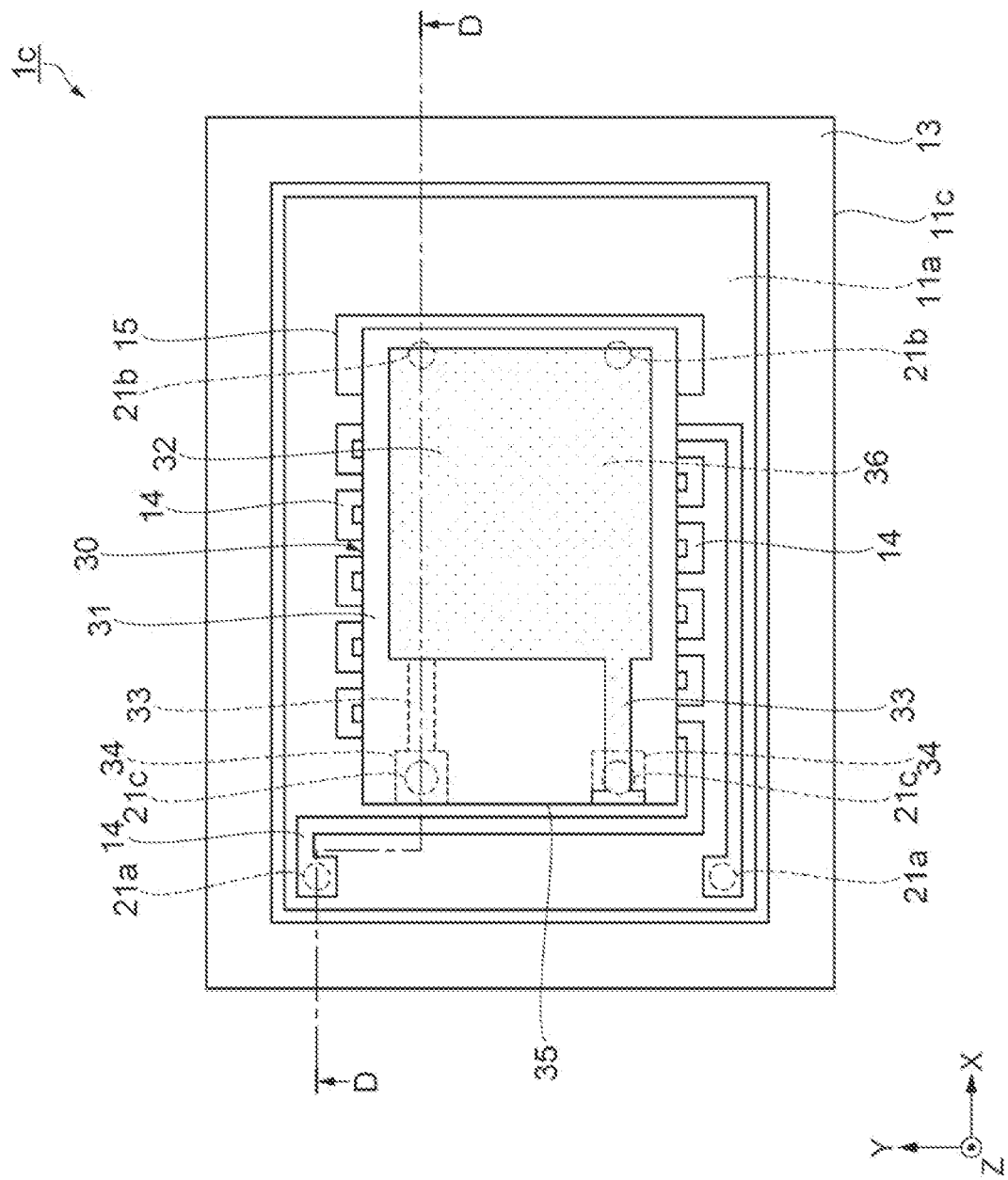
FIG. 9 is a plan view showing a schematic structure of a resonator device according to a fourth embodiment.
Figure 10:
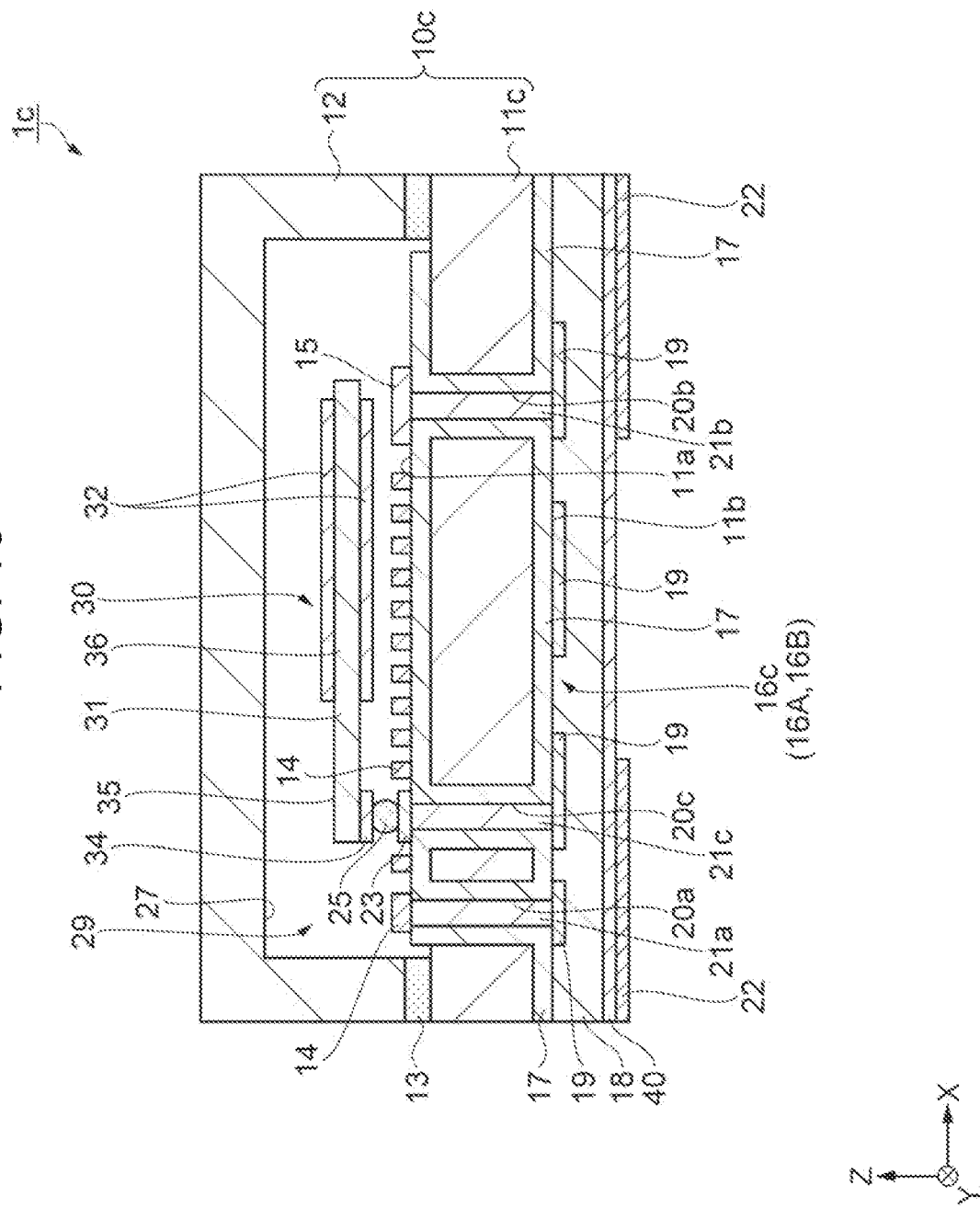
FIG. 10 is a cross-sectional view along the line D-D in FIG. 9.

As shown in FIG. 9 and FIG. 10, in the resonator device 1c, the circuit 16c provided with the temperature control circuit 16A and the oscillation circuit 16B is disposed at the second surface 11b side of the substrate 11c constituting a package 10c. On the circuit 16c, there is disposed the insulating layer 40 covering the circuit 16c. It should be noted that the insulating layer 40 functions as a passivation film, and as the insulating layer 40, there are used silicon nitride, silicon oxide, an organic material such as polyimide, and so on.

The substrate 11c has the first through electrodes 21a which are disposed in through holes 20a penetrating the first surface 11a and the second surface 11b, and electrically couple the heater 14 and the circuit 16c to each other, the second through electrodes 21b which are disposed in through holes 20b penetrating the first surface 11a and the second surface 11b, and electrically couple the temperature sensor 15 and the circuit 16c to each other, and the third through electrodes 21c which are disposed in through holes 20c penetrating the first surface 11a and the second surface 11b, and electrically couple the resonator element 30 and the circuit 16c to each other.

By adopting such a configuration, the electrical coupling of the heater 14, the temperature sensor 15, and the resonator element 30 to the circuit 16c becomes easy. Further, there is no need to lay wiring from the internal space 29 to the outside of the substrate 11c in order to electrically couple the heater 14, the temperature sensor 15, and the resonator element 30 to the circuit 16c. Therefore, it is possible to more surely ensure the airtightness of the internal space 29. Further, by covering the circuit 16c with the insulating layer 40, it is possible to effectively prevent the heat of the resonator element 30 from being released to the outside via the substrate 11c. Therefore, it becomes easier to keep the temperature of the resonator element 30 constant, and at the same time, it is possible to reduce the power consumption of the heater 14, and thus, it is possible to obtain substantially the same advantages as in the resonator device 1 according to the first embodiment.

5. Fifth Embodiment

Then, a resonator device 1d according to a fifth embodiment will be described with reference to FIG. 11 and FIG. 12. It should be noted that in FIG. 11, for the sake of convenience of explanation of an internal configuration of the resonator device 1d, there is illustrated a state in which a lid 12d is removed.

The resonator device 1d according to the present embodiment is substantially the same as the resonator device 1 according to the first embodiment except the fact a heat-insulating layer 26 is disposed on a surface 28 of the lid 12d at a side of the space housing the resonator element 30 compared to the resonator device 1 according to the first embodiment. It should be noted that there is presented the description with a focus on the differences from the first embodiment described above, and regarding substantially the same matters, the same reference symbols are provided, and the explanation thereof will be omitted.

Figure 11:
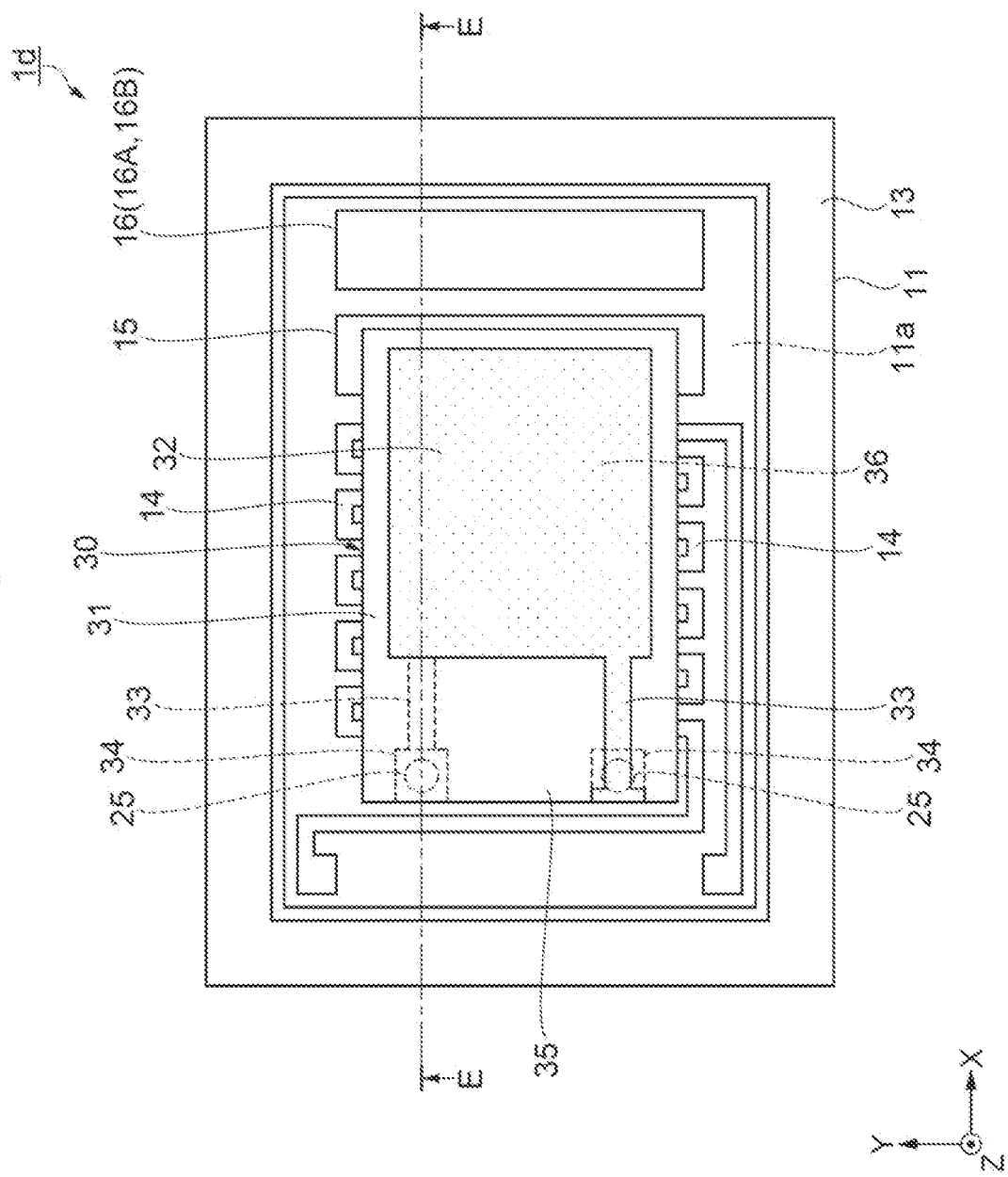
FIG. 11 is a plan view showing a schematic structure of a resonator device according to a fifth embodiment.
Figure 12:
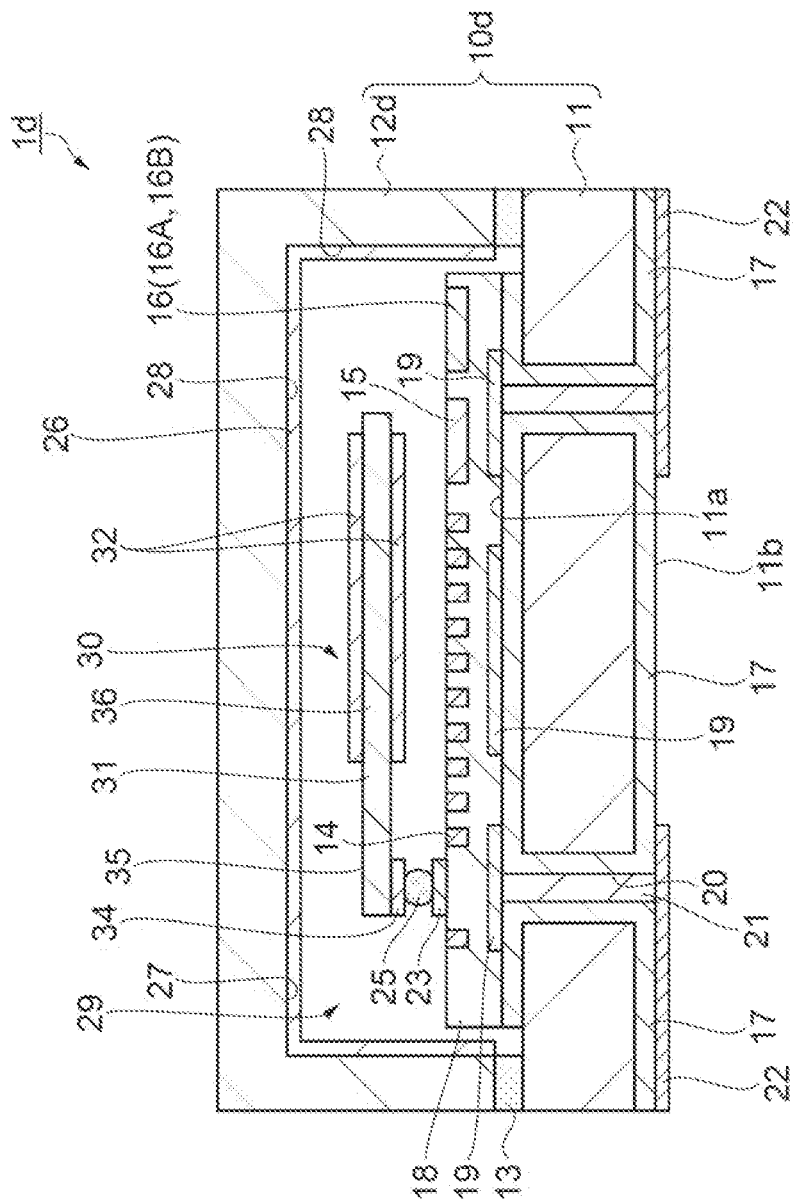
FIG. 12 is a cross-sectional view along the line E-E in FIG. 11.

As shown in FIG. 11 and FIG. 12, in the resonator device 1d, the heat-insulating layer 26 is disposed on the surface 28 of the lid 12d constituting a package 10d, wherein the surface 28 is located in the space housing the resonator element 30. It should be noted that the heat-insulating layer 26 is formed of a material lower in thermal conductivity than the substrate 11 and the lid 12d. As such a heat-insulating layer 26, there are used silicon oxide, a porous resin material such as porous polyimide, a variety of glass materials, and an inorganic porous material such as silica aerogel.

By adopting such a configuration, it becomes easier to keep the temperature of the resonator element 30 constant with the heat-insulating layer 26, and at the same time, it is possible to reduce the power consumption of the heater 14, and thus, it is possible to obtain substantially the same advantages as in the resonator device 1 according to the first embodiment.

What is claimed is:

1. A resonator device comprising:
   a substrate provided with a first surface and a second surface located at an opposite side to the first surface;
   a heater disposed at the first surface of the substrate;
   a temperature sensor disposed at the first surface of the substrate;
   a resonator element which is arranged at the first surface of the substrate, and has a first bond part bonded to the substrate;
   a lid which is bonded to the substrate to form an internal space together with the substrate, the internal space accommodating the heater, the temperature sensor, and the resonator element; and
   a circuit which is disposed at either one of the first surface and the second surface, and is provided with a temperature control circuit configured to control the heater based on an output of the temperature sensor, wherein
   the first bond part is arranged to overlap the heater in a plan view from a direction perpendicular to the first surface.

2. The resonator device according to claim 1, wherein
   the resonator element has a vibrating part and a second bond part bonded to the substrate, and
   the second bond part is arranged at an opposite side to the first bond part across the vibrating part, and is arranged to overlap the heater in the plan view.

3. The resonator device according to claim 1, wherein the temperature sensor is surrounded by the heater in the plan view.

4. The resonator device according to claim 1, wherein
   the circuit is disposed at the second surface, and
   the substrate includes
      a first through electrode which penetrates the first surface and the second surface, and electrically couples the heater and the circuit to each other, and
      a second through electrode which penetrates the first surface and the second surface, and electrically couples the temperature sensor and the circuit to each other.

5. The resonator device according to claim 4, wherein
   the circuit includes an oscillation circuit, and
   the substrate includes a third through electrode which penetrates the first surface and the second surface, and electrically couples the resonator element and the circuit to each other.

6. The resonator device according to claim 4, further comprising:
   an insulating layer which is disposed at the second surface of the substrate, and covers the circuit.

7. The resonator device according to claim 1, wherein the lid has a heat-insulating layer arranged on a surface at a side of a space housing the resonator element.

* * * * *